US009263530B2

(12) United States Patent
Cheng et al.

(10) Patent No.: US 9,263,530 B2
(45) Date of Patent: Feb. 16, 2016

(54) FIELD EFFECT TRANSISTOR

(71) Applicants: EPISTAR CORPORATION, Hsinchu (TW); HUGA OPTOTECH INC., Taichung (TW)

(72) Inventors: Chih-Ching Cheng, Taichung (TW); Tsung-Cheng Chang, Taichung (TW)

(73) Assignees: EPISTAR CORPORATION, Hsinchu (TW); HUGA OPTOTECH INC., Taichung (TW)

( * ) Notice: Subject to any disclaimer, the term of this patent is extended or adjusted under 35 U.S.C. 154(b) by 0 days.

(21) Appl. No.: 14/140,260

(22) Filed: Dec. 24, 2013

(65) Prior Publication Data

US 2014/0175517 A1 Jun. 26, 2014

(30) Foreign Application Priority Data

Dec. 25, 2012 (TW) .............................. 101149883 A

(51) Int. Cl.
*H01L 29/778* (2006.01)
*H01L 29/207* (2006.01)
*H01L 29/20* (2006.01)
*H01L 29/66* (2006.01)
*H01L 29/36* (2006.01)
*H01L 29/10* (2006.01)

(52) U.S. Cl.
CPC .......... *H01L 29/207* (2013.01); *H01L 29/1075* (2013.01); *H01L 29/2003* (2013.01); *H01L 29/36* (2013.01); *H01L 29/66431* (2013.01); *H01L 29/66439* (2013.01); *H01L 29/66462* (2013.01); *H01L 29/778* (2013.01); *H01L 29/7786* (2013.01)

(58) Field of Classification Search
None
See application file for complete search history.

(56) References Cited

U.S. PATENT DOCUMENTS

| | | | | |
|---|---|---|---|---|
| 2006/0197109 A1* | 9/2006 | Saxler | ........................... | 257/201 |
| 2007/0069239 A1* | 3/2007 | Kosaki et al. | ................ | 257/189 |
| 2007/0272945 A1* | 11/2007 | Matsuo et al. | ................ | 257/194 |
| 2010/0289067 A1* | 11/2010 | Mishra et al. | ................ | 257/268 |
| 2011/0291160 A1* | 12/2011 | Ota et al. | ........................ | 257/194 |
| 2013/0200495 A1* | 8/2013 | Keller et al. | ................. | 257/615 |
| 2013/0240901 A1* | 9/2013 | Kohda et al. | .................. | 257/76 |
| 2013/0271208 A1* | 10/2013 | Then et al. | ..................... | 327/541 |
| 2013/0341635 A1* | 12/2013 | Cao et al. | ......................... | 257/76 |

FOREIGN PATENT DOCUMENTS

| | | | |
|---|---|---|---|
| CN | 100530544 C | | 8/2009 |
| JP | 20129630 A | | 1/2012 |
| TW | 579600 | | 3/2004 |
| WO | WO2012066701 | * | 5/2012 |

* cited by examiner

*Primary Examiner* — Fei Fei Yeung Lopez
(74) *Attorney, Agent, or Firm* — Muncy, Geissler, Olds & Lowe, P.C.

(57) ABSTRACT

A field effect transistor (FET) disclosed herein comprising a substrate, a C-doped semiconductor layer disposed on the substrate, a channel layer disposed on the C-doped semiconductor layer, and an electron supply layer disposed on the channel layer. The FET further comprises a diffusion barrier layer disposed between the C-doped semiconductor layer and the channel layer, wherein the diffusion barrier layer contacts the channel layer directly.

20 Claims, 3 Drawing Sheets

FIELD EFFECT TRANSISTOR

CROSS-REFERENCE TO RELATED APPLICATION

This application claims the priority benefit of Taiwan application no. 101149883, filed on Dec. 25, 2012. The entirety of the above-mentioned patent application is hereby incorporated by reference herein and made a part of this specification.

BACKGROUND

1. Field of the Invention

The present application relates to an electronic device, and more particularly to a field effect transistor.

2. Description of Related Art

Recently, III-V compound materials, such as GaN, have been developed rapidly in high power devices. The III-V compound materials allow two-dimensional electron gas (2DEG) to generate in a junction by a piezoelectric effect. Due to the high speed, high density and low conductive resistance of electrons, the III-V compound materials have advantages of high power output, high voltage operation and low switching loss.

According to prior researches, it is found that a field effect transistor with a C-doped GaN layer serving as a buffer layer may have a high breakdown voltage if a thinned channel layer (or called a spacing layer) is disposed therein.

However, referring to FIG. 1, the experimental data shown in FIG. 1 are obtained by using a C-doped GaN layer with a C-doping concentration of about 1E18 cm$^{-3}$, growing intrinsic GaN (i-GaN) layers with different thicknesses as channel layers on the C-doped GaN layer, forming an $Al_{0.25}GaN_{0.75}$ layer with a thickness of about 20 nm, and then measuring an electron mobility thereof. Then it is found that when the channel layers are thinner, there is a problem that the electron mobility decreases because carbon ions in the C-doped GaN layer diffuse into the region of two-dimensional electron gas (2DEG) between the i-GaN layers and the $Al_{0.25}GaN_{0.75}$ layer, which reduces the electron mobility.

SUMMARY OF THE INVENTION

A field effect transistor (FET) comprises a substrate, a C-doped semiconductor layer disposed on the substrate, a channel layer disposed on the C-doped semiconductor layer, and an electron supply layer disposed on the channel layer, wherein two-dimensional electron gas (2DEG) is generated in an interface between the channel layer and the electron supply layer. The FET further comprises a diffusion barrier layer comprising an Al content and disposed between the C-doped semiconductor layer and the channel layer, wherein the diffusion barrier layer contacts the channel layer directly.

A field effect transistor (FET) comprises a substrate, a first Al-containing semiconductor layer disposed over the substrate and being a C-doped layer, a second Al-containing semiconductor layer disposed on the first Al-containing semiconductor layer, and a third Al-containing semiconductor layer disposed on the second Al-containing semiconductor layer. The FET further comprises a diffusion bather layer comprising an Al content and disposed between the first Al-containing semiconductor layer and the second Al-containing semiconductor layer, wherein the Al content in the diffusion barrier layer is greater than an Al content in the first Al-containing semiconductor layer and an Al content in the second Al-containing semiconductor layer.

Based on the above, by disposing a diffusion barrier layer between a channel layer and a C-doped semiconductor layer, the present disclosure allows the FET to have a high breakdown voltage, while an electron mobility of the FET is not influenced but even improved.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF EMBODIMENTS

Figure 1:
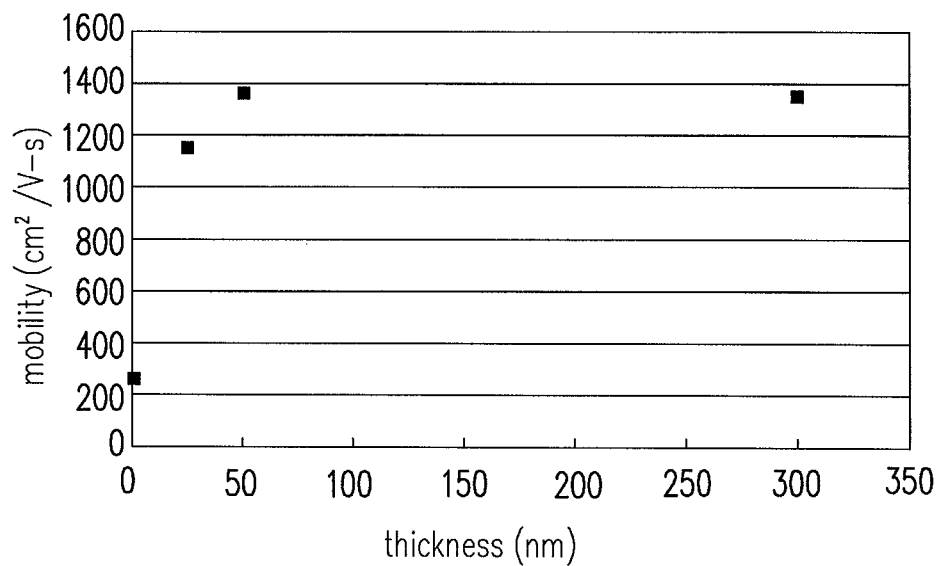
FIG. 1 is a curve diagram illustrating a correlation between a thickness of an i-GaN layer and a mobility of a field effect transistor (FET).

In order to make the aforementioned features and advantages of the present application more comprehensible, embodiments accompanying figures are described in details below.

A description accompanied with drawings is provided in the following to explain embodiments of the present application. However, the invention may still be implemented in many other different forms and should not be construed as limited to the embodiments described herein. In the drawings, for the purpose of clarity, the sizes and relative sizes of each layer and region in the drawings may be illustrated in exaggerated proportions.

Figure 2:
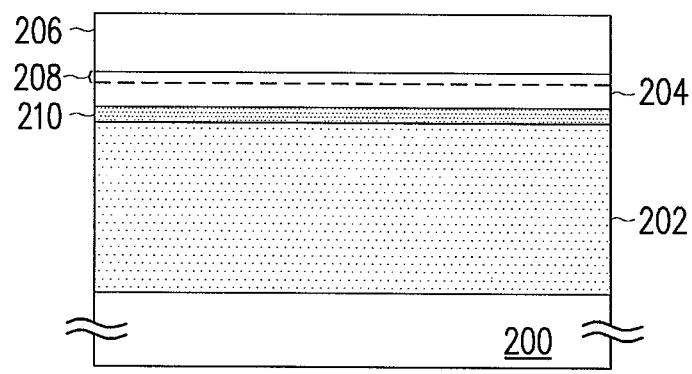
FIG. 2 is a cross-sectional view of an FET according to one embodiment of the present disclosure.

FIG. 2 is a cross-sectional view of an FET according to an embodiment of the present application.

Referring to FIG. 2, a field effect transistor (FET) of one embodiment comprises a substrate 200, a C-doped semiconductor layer 202 on the substrate 200, an intrinsic semiconductor channel layer 204 on the C-doped semiconductor layer 202, and an electron supply layer 206 on the intrinsic semiconductor channel layer 204, wherein a two-dimensional electron gas (2DEG) 208 generates in an interface between the intrinsic semiconductor channel layer 204 and the electron supply layer 206. In addition, the FET of the present embodiment further comprises an Al-containing diffusion barrier layer 210 between the C-doped semiconductor layer 202 and the intrinsic semiconductor channel layer 204, wherein the Al-containing diffusion barrier layer 210 contacts the intrinsic semiconductor channel layer 204 directly in order to prevent carbon ions in the C-doped semiconductor layer 202 from diffusing into the region of the 2DEG 208.

Figure 3:
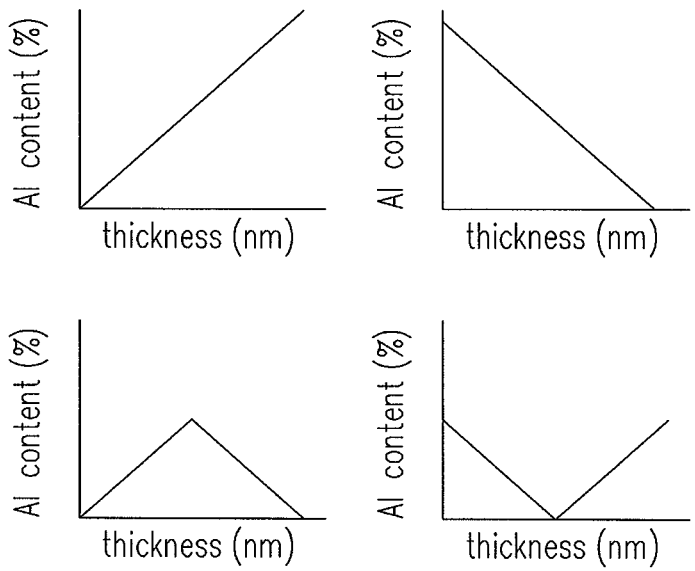
FIG. 3 is a curve diagram illustrating how Al content of a diffusion barrier layer in FIG. 2 varies with thickness.

In FIG. 2, the Al-containing diffusion barrier layer 210 is, for example, AlGaN, AlInGaN, MN or other suitable Al-containing materials, and Al content thereof is between 2% and 20%, preferably between 2% and 5%. Furthermore, in addition to an uniform distribution, the Al content (%) in the Al-containing diffusion barrier layer 210, as shown in FIG. 3, may increase continuously with a thickness of an epitaxial along the direction from the C-doped semiconductor layer 202 to the intrinsic semiconductor channel layer 204, decrease continuously along the direction from the C-doped semiconductor layer 202 to the intrinsic semiconductor channel layer 204, decrease from the middle of the Al-containing diffusion barrier layer 210 to the intrinsic semiconductor channel layer 204 and the C-doped semiconductor layer 202 respectively, or increase from the middle of the Al-containing diffusion barrier layer 210 to the intrinsic semiconductor channel layer 204 and the C-doped semiconductor layer 202 respectively. A thickness of the Al-containing diffusion barrier layer 210 is, for example, between 5 nm and 30 nm, but it is not limited thereto. The Al-containing diffusion barrier layer 210 may not be too thick, otherwise a polarization effect of the 2DEG 208 may be destroyed to decrease a carrier concentration of the 2DEG 208. However, the Al-containing diffusion barrier layer 210 may not be too thin, or the Al-containing diffusion barrier layer 210 may be unable to prevent carbon ions in the C-doped semiconductor layer 202 from diffusing into the intrinsic semiconductor channel layer 204. A thickness of the intrinsic semiconductor channel layer 204 is, for example, 100 nm or less, and preferably 50 nm or less, such as between 10 nm and 50 nm.

Referring to FIG. 2, the substrate 200 of the present embodiment may be a single crystal substrate made of materials such as silicon, silicon carbide, gallium nitride, aluminum gallium nitride, or aluminum nitride; or may be a composite substrate comprising materials such as silicon, silicon carbide, gallium nitride, aluminum gallium nitride, or aluminum nitride. The electron supply layer 206 may be III-V compound semiconductor materials, such as an aluminum gallium nitride layer. The intrinsic semiconductor channel layer 204 may be HI-V compound semiconductor materials, such as a gallium nitride layer. The C-doped semiconductor layer 202 may be III-V compound semiconductor materials, such as a C-doped gallium nitride layer or a C-doped aluminum gallium nitride layer (generally, a molar ratio of aluminum is between 0% and 25%). The intrinsic semiconductor channel layer 204 may be an un-doped semiconductor or a semiconductor with a low carbon concentration (about less than $3E17\,cm^{-3}$), and the low carbon concentration content is generated naturally during an epitaxial process instead of being generated by intentional doping. A C-doping concentration of the C-doped semiconductor layer 202 is between about $1E18\,cm^{-3}$ and about $5E19\,cm^{-3}$.

Figure 4:
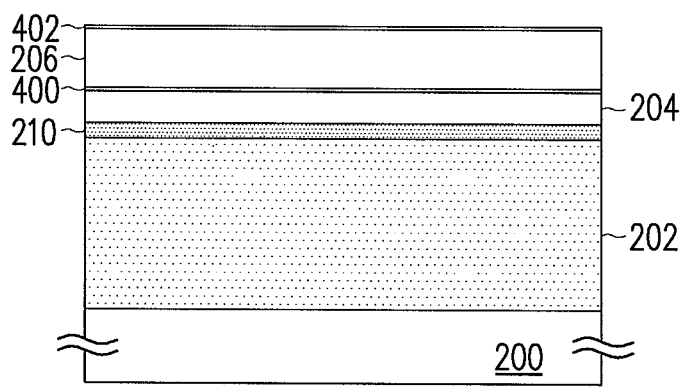
FIG. 4 is a cross-sectional view of the FET in FIG. 2 according to another embodiment of the present disclosure.

FIG. 4 is a cross-sectional view of the FET in FIG. 2 according to another embodiment. The FET in FIG. 4 further comprises an AlN layer 400 disposed between the intrinsic semiconductor channel layer 204 and the electron supply layer 206 to enhance the polarization effect so as to increase the carrier concentration of the 2DEG. In addition, the AlN layer 400 with a thickness of only a few nanometers, such as 1 nm, is able to increase the carrier concentration and the electron mobility. Furthermore, a protection layer 402, such as a GaN layer with a thickness of a few nanometers, may be further disposed on a surface of the electron supply layer 206 to prevent the surface of the electron supply layer 206 from reacting with other substances in the manufacturing process or with water vapor and moisture in the air, which influences the electrical property to undergo unstable changes. In other words, the protection layer 402 protects a surface state of the electron supply layer 206.

Figure 5:
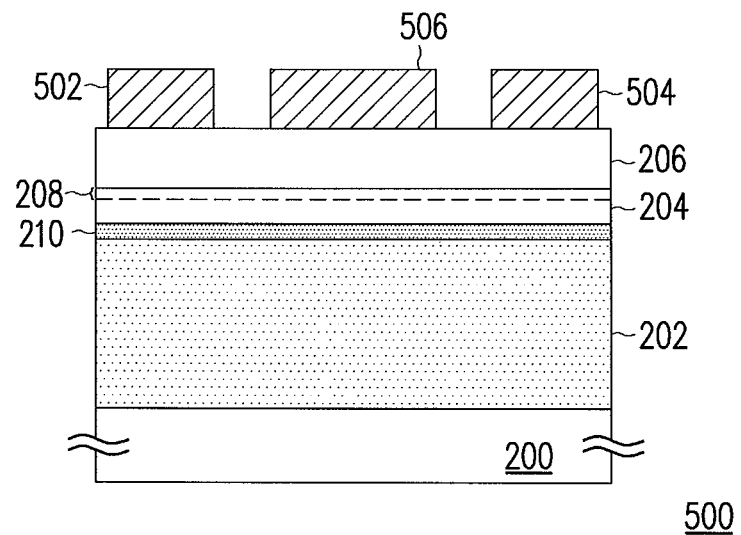
FIG. 5 is an overall schematic view of the FET in FIG. 2.

FIG. 5 is an overall schematic view of the FET in FIG. 2. In other words, when the FET in FIG. 2 is applied in a power device 500, a source 502 and a drain 504 are disposed on the electron supply layer 206, and a gate 506 is disposed on the electron supply layer 206. Materials of the source 502 and the drain 504 are, for example, Ni/Au. A material of the gate 506 is, for example, Ni/Au.

Figure 6:
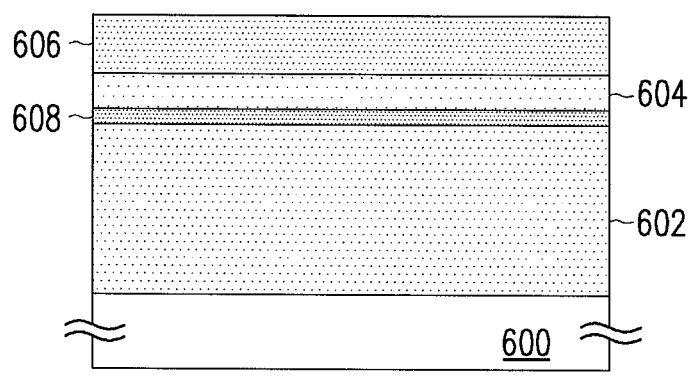
FIG. 6 is a schematic cross-sectional view of an FET according to another embodiment of the present disclosure.

FIG. 6 is a cross-sectional view of an FET according to another embodiment of the invention.

Referring to FIG. 6, the FET of another embodiment comprises a substrate 600, a first Al-containing semiconductor layer 602 on the substrate 600, a second Al-containing semiconductor layer 604 on the first Al-containing semiconductor layer 602, and a third Al-containing semiconductor layer 606 on the second Al-containing semiconductor layer 604. The first Al-containing semiconductor layer 602 is a C-doped layer. The FET further comprises an Al-containing diffusion barrier layer 608 between the first Al-containing semiconductor layer 602 and the second Al-containing semiconductor layer 604, wherein an Al content in the Al-containing diffusion barrier layer 608 is greater than an Al content in the first Al-containing semiconductor layer 602 and an Al content in the second Al-containing semiconductor layer 604, and the Al content in the Al-containing diffusion barrier layer 608 is, for example, between 7% and 25%, and preferably between 7% and 10%.

In FIG. 6, like the previous embodiment, in addition to an uniform distribution, the Al content in the Al-containing diffusion barrier layer 608 may decrease continuously along the direction from the first Al-containing semiconductor layer 602 to the second Al-containing semiconductor layer 604, increase continuously along the direction from first Al-containing semiconductor layer 602 to the second Al-containing semiconductor layer 604, decrease from the middle of the Al-containing diffusion barrier layer 608 to the second Al-containing semiconductor layer 604 and the first Al-containing semiconductor layer 602 respectively, or increase from the middle of the Al-containing diffusion barrier layer 608 to the second Al-containing semiconductor layer 604 and the first Al-containing semiconductor layer 602 respectively. A thickness of the second Al-containing semiconductor layer 604 is, for example, 100 nm or less, and preferably 50 nm or less, such as between 10 nm and 50 nm. A thickness of the Al-containing diffusion barrier layer 608 is, for example, between 5 nm and 30 nm, but the invention is not limited thereto. However, the Al-containing diffusion barrier layer 608 may not be too thick so as to retain the polarization effect of the 2DEG and to prevent the carrier concentration from decreasing. In addition, the Al-containing diffusion barrier layer 608 may not be too thin in order to keep the Al-containing diffusion barrier layer 608 from losing the ability of preventing the diffusion of carbon ions in the first Al-containing semiconductor layer 602. In addition, an AlN layer (not shown) may be further disposed between the second and third Al-containing semiconductor layers 604 and 606 to increase the carrier concentration and the electron mobility. The additional AlN layer requires a thickness of only a few nanometers (such as 1 nm). A protection layer (not shown), such as a GaN layer with a thickness of a few nanometers (such as 1.5 nm), may be further disposed on a surface of the third Al-containing semiconductor layer 606 to protect a surface state.

In FIG. 6, the substrate 600 may be a single crystal substrate made of materials such as silicon, silicon carbide, gallium nitride, aluminum gallium nitride, or aluminum nitride. The third Al-containing semiconductor layer 606 may be III-V compound semiconductor materials, such as an aluminum gallium nitride layer. The second Al-containing semiconductor layer 604 may be III-V compound semiconductor materials, such as a gallium nitride layer or an aluminum gallium nitride layer. The Al-containing diffusion barrier layer 608 is, for example, AlGaN, AlN, AlInGaN or other suitable Al-containing materials. The first Al-containing semiconductor layer 602 may be III-V compound semiconductor materials, such as a C-doped aluminum gallium nitride layer (generally, a molar ratio of aluminum is between 0% and 25%). The second Al-containing semiconductor layer 604 may be an un-doped semiconductor or a semiconductor with a low carbon concentration (about less than $3E17$ cm$^{-3}$), and the low carbon concentration content is generated naturally during an epitaxial process instead of being generated by intentional doping. A C-doping concentration of the first Al-containing semiconductor layer 602 is between about $1E18$ cm$^{-3}$ and about $5E19$ cm$^{-3}$.

Based on the above, the present application increases the breakdown voltage and maintains the electron mobility at the same time by disposing an Al-containing diffusion barrier layer between a C-doped semiconductor layer and a semiconductor channel layer on the C-doped semiconductor layer so as to prevent carbon ions in the C-doped semiconductor layer from diffusing into a region of two-dimensional electron gas in an interface between the channel layer and an electron supply layer.

Although the invention has been described with reference to the above embodiments, they are not intended to limit the invention. It is apparent to people of ordinary skill in the art that modifications and variations to the invention may be made without departing from the spirit and scope of the invention. In view of the foregoing, the protection scope of the invention will be defined by the appended claims.

What is claimed is:

1. A field effect transistor, comprising:
a substrate;
a C-doped semiconductor layer disposed on the substrate;
a channel layer disposed on the C-doped semiconductor layer;
an electron supply layer disposed on the channel layer, wherein a two-dimensional electron gas generates in an interface between the channel layer and the electron supply layer; and
a diffusion barrier layer comprising an Al content and disposed between the C-doped semiconductor layer and the channel layer, wherein
the diffusion barrier layer contacts the channel layer and the C-doped semiconductor layer directly, and
a thickness of the diffusion barrier layer is between 5 nm and 30 nm,
wherein the Al content in the diffusion barrier layer decreases or increases from the middle of the diffusion barrier layer toward the channel layer and the C-doped semiconductor layer, respectively.

2. The field effect transistor according to claim 1, wherein the Al content in the diffusion barrier layer is between 2% and 20%.

3. The field effect transistor according to claim 1, wherein the diffusion barrier layer comprises AlGaN, AlInGaN or AlN.

4. The field effect transistor according to claim 1, wherein the thickness of the channel layer is 50 nm or less.

5. The field effect transistor according to claim 1, further comprising an AlN layer disposed between the channel layer and the electron supply layer.

6. The field effect transistor according to claim 1, wherein the C-doped semiconductor layer, the channel layer and the electron supply layer are III-V compound semiconductor materials.

7. A field effect transistor, comprising:
a substrate;
a first Al-containing semiconductor layer disposed over the substrate and being a C-doped layer;
a second Al-containing semiconductor layer disposed on the first Al-containing semiconductor layer;
a third Al-containing semiconductor layer disposed on the second Al-containing semiconductor layer;
a diffusion barrier layer comprising an Al content and disposed between the first Al-containing semiconductor layer and the second Al-containing semiconductor layer, wherein the Al content in the diffusion barrier layer is greater than an Al content in the first Al-containing semiconductor layer and an Al content in the second Al-containing semiconductor layer,
wherein the second Al-containing semiconductor layer and the third Al-containing semiconductor layer are arranged for generating a two-dimensional electron gas in an interface therebetween.

8. The field effect transistor according to claim 7, wherein the Al content in the diffusion barrier layer is between 7% and 25%.

9. The field effect transistor according to claim 7, wherein the Al content in the diffusion barrier layer decreases or increases continuously along a direction from the first Al-containing semiconductor layer to the second Al-containing semiconductor layer.

10. The field effect transistor according to claim 7, wherein the Al content in the diffusion barrier layer decreases or increases from the middle of the diffusion barrier layer toward the second Al-containing semiconductor layer and the first Al-containing semiconductor layer, respectively.

11. The field effect transistor according to claim 7, wherein a thickness of the diffusion barrier layer is between 5 nm and 30 nm.

12. The field effect transistor according to claim 7, wherein the diffusion barrier layer comprises AlGaN, AlInGaN or AlN.

13. The field effect transistor according to claim 7, wherein the thickness of the second Al-containing semiconductor layer is 50 nm or less.

14. The field effect transistor according to claim 7, further comprising an AlN layer disposed between the second Al-containing semiconductor layer and the third Al-containing semiconductor layer.

15. The field effect transistor according to claim 7, wherein the first Al-containing semiconductor layer, the second Al-containing semiconductor layer, and the third Al-containing semiconductor layer are III-V compound semiconductor materials.

16. The field effect transistor according to claim 1, wherein the diffusion barrier layer is a single layer.

17. The field effect transistor according to claim 7, wherein the diffusion barrier layer is a single layer.

18. The field effect transistor according to claim 5, wherein a thickness of the AlN layer is 1 nm.

19. The field effect transistor according to claim 1, wherein the substrate is a single crystal substrate or a composite substrate.

20. The field effect transistor according to claim 1, wherein the material of the substrate comprises silicon, silicon carbide, gallium nitride, aluminum gallium nitride, or aluminum nitride.

* * * * *